United States Patent [19]

Bakker

[11] Patent Number: 4,725,918
[45] Date of Patent: Feb. 16, 1988

[54] PROTECTIVE INSERT FOR CHIP CARRIERS

[75] Inventor: Roel J. Bakker, York, Pa.

[73] Assignee: General Patent Counsel/AMP Incorporated, Harrisburg, Pa.

[21] Appl. No.: 899,457

[22] Filed: Aug. 22, 1986

[51] Int. Cl.⁴ .................................................. H05F 1/00
[52] U.S. Cl. .................................... 361/220; 206/331; 324/158 F; 439/507
[58] Field of Search .............................. 361/212, 220; 324/158 F; 206/328, 331; 439/507

[56] References Cited

U.S. PATENT DOCUMENTS

| | | | |
|---|---|---|---|
| 3,648,108 | 3/1972 | Bailey | 361/212 |
| 3,653,498 | 4/1972 | Kisor | 361/212 |
| 4,549,651 | 10/1985 | Alemanni | 206/331 X |
| 4,564,880 | 1/1986 | Christ et al. | 361/212 |

Primary Examiner—L. T. Hix
Assistant Examiner—Brian W. Brown
Attorney, Agent, or Firm—Bruce J. Wolstoncroft

[57] ABSTRACT

A protective insert for use with a protective fixture for a chip carrier has walls and an arm. The insert is positioned in openings of the fixture by way of an interference fit. The arm contacts leads of a chip carrier positioned in the fixture, protecting the integrated circuit from electrostatic discharge. A hinge means provided between the walls and the arm allows the insert to protect the chip carrier during transportation while still permitting easy testing of the chip carrier. As the chip carrier is needed, the insert is removed and reused in transportation of another chip carrier.

7 Claims, 4 Drawing Figures

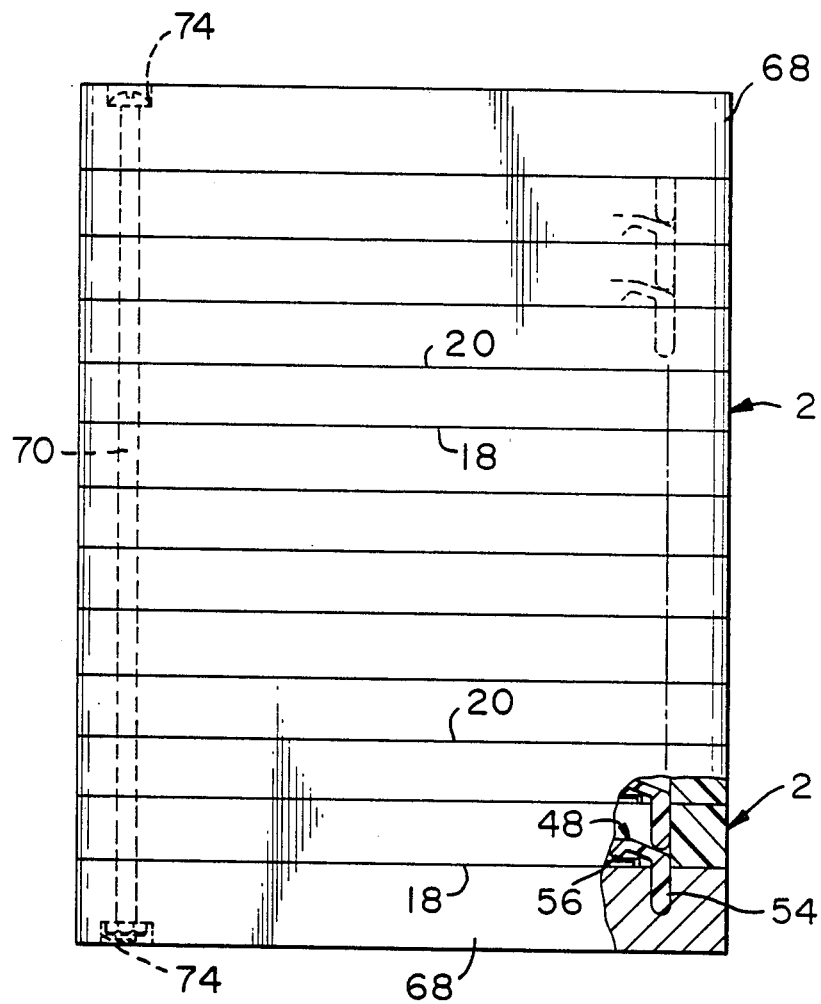

PROTECTIVE INSERT FOR CHIP CARRIERS

FIELD OF THE INVENTION

This invention relates to a protective insert for a chip carrier socket and particularly to an insert which avoids electrostatic discharge of the chip during transportation thereof, thereby protecting the integrated circuit from harmful static electricity.

BACKGROUND OF THE INVENTION

Integrated circuits are commonly mounted on a substrate or the like which are referred to as chip carriers. Conductors on the chip carrier are connected to the integrated circuit and extend to the edges of the carrier. Sheet metal leads are connected to these conductors on the carrier and extend outwardly from the edges of the substrate. When the integrated circuit is placed in service, these leads in turn are soldered to terminal areas on a circuit board.

A problem with this type of chip carriers is that the physical handling of the chip carrier must be done with extreme care so as not to damage any of the fragile components of the chip carrier. U.S. patent application Ser. No. 784,917 filed Oct. 4, 1985 discloses a protective fixture for use with a chip carrier, the fixture protects the chip carrier from physical damage during transportation of the chip carrier.

A second, equally important problem with the chip carriers relates to their lack of protection to static electricity. A rapid discharge of static electricity in the vicinity of the integrated circuit damages the integrated circuit. It is therefore beneficial to provide some type of protection which eliminates this problem and ensures that the chip will remain unharmed during transportation thereof. The prior art teaches various methods for controlling this discharge of static electricity; however, many inherent problems are present in these solutions. These inherent problems include: (1) non-uniform conductivity of the materials used, creating pockets of inadequate static protection; (2) inadequate static protection of materials used, i.e., the material conducts too well leading to rapid discharge; and (3) inadequate static protection because the design of the chip carrier requires the integrated circuit to be removed from the chip carrier which promotes excess handling of the integrated circuit. As of these problems have the same end result—damage to the integrated circuit.

An example of the prior art is disclosed in U.S. Pat. No. 4,564,880. An integrated circuit carrier having uniform conductivity and the ability to securely hold an integrated circuit in a predetermined position within the carrier is disclosed. The enclosure is formed as one piece which additionally includes a hinge, a latching arrangement, structure which aids stacking, and structure which facilitates opening of the enclosure by automated means. The problem encountered with this type of chip carrier deals with the problem of handling the chip when tests are made. The integrated circuit must be physically removed from the enclosure, tested, and returned to the chip carrier for protection. In other words, the chip carrier provides no manner of testing of the integrated circuit while the integrated circuit is maintained in the chip carrier.

To properly protect the integrated circuit, it would be advantageous to provide a chip carrier fixture which protects the integrated circuit from physical damage as well as electrical damage while still permitting testing of the integrated circuit without requiring the integrated circuit to be removed from the fixture.

SUMMARY OF THE INVENTION

The present invention is directed to a protective insert for use with a protective fixture for a chip carrier. The insert and the fixture protect the chip carrier and leads thereof from both physical damage as well as electrical damage.

The insert has sidewalls positioned parallel to each other. A backwall connects the sidewalls together, the backwall being perpendicular to the sidewalls. An arm extends from the backwall in the same direction as the sidewalls. The arm has a contact section and end section located thereon. The contact section has contact means which cooperate with the leads of the chip carrier. The end section is essentially parallel to the backwall and has a free end which extends beyond the contact means. A pivot means joins the arm to the backwall.

The insert is placed in an opening of a protective fixture. The walls of the insert cooperate with walls of the opening to provide an interference fit which maintains the insert in the opening. The contact means of the insert contacts the leads of the chip carrier causing the leads of the chip carrier to short, protecting the integrated circuit from electrostatic discharge. As the fixture is tested, the end section of the arm causes the arm to pivot about the pivot means, disengaging the contact means from the leads.

A further object of the present invention is to provide an insert which will protect the chip during transportation while still permitting testing of the chip under ideal circumstances, i.e., with the insert not engaging the lead frame. Therefore, the insert must automatically disengage the lead frame as testing occurs and automatically re-engaged the lead frame when the testing is complete.

An additional object of the present invention is to allow the protective fixtures to be stacked on top of each other to allow the chip carriers to be tested in groups. The inserts are made such that when the bottom insert is moved, the other inserts stacked above will move in a similar manner.

BRIEF DESCRIPTION OF THE DRAWINGS

FIG. 4 is a diagrammatic view of the fixtures stacked together with a cut-away section showing how the inserts cooperate with each other.

DETAILED DESCRIPTION OF THE INVENTION

Figure 1:
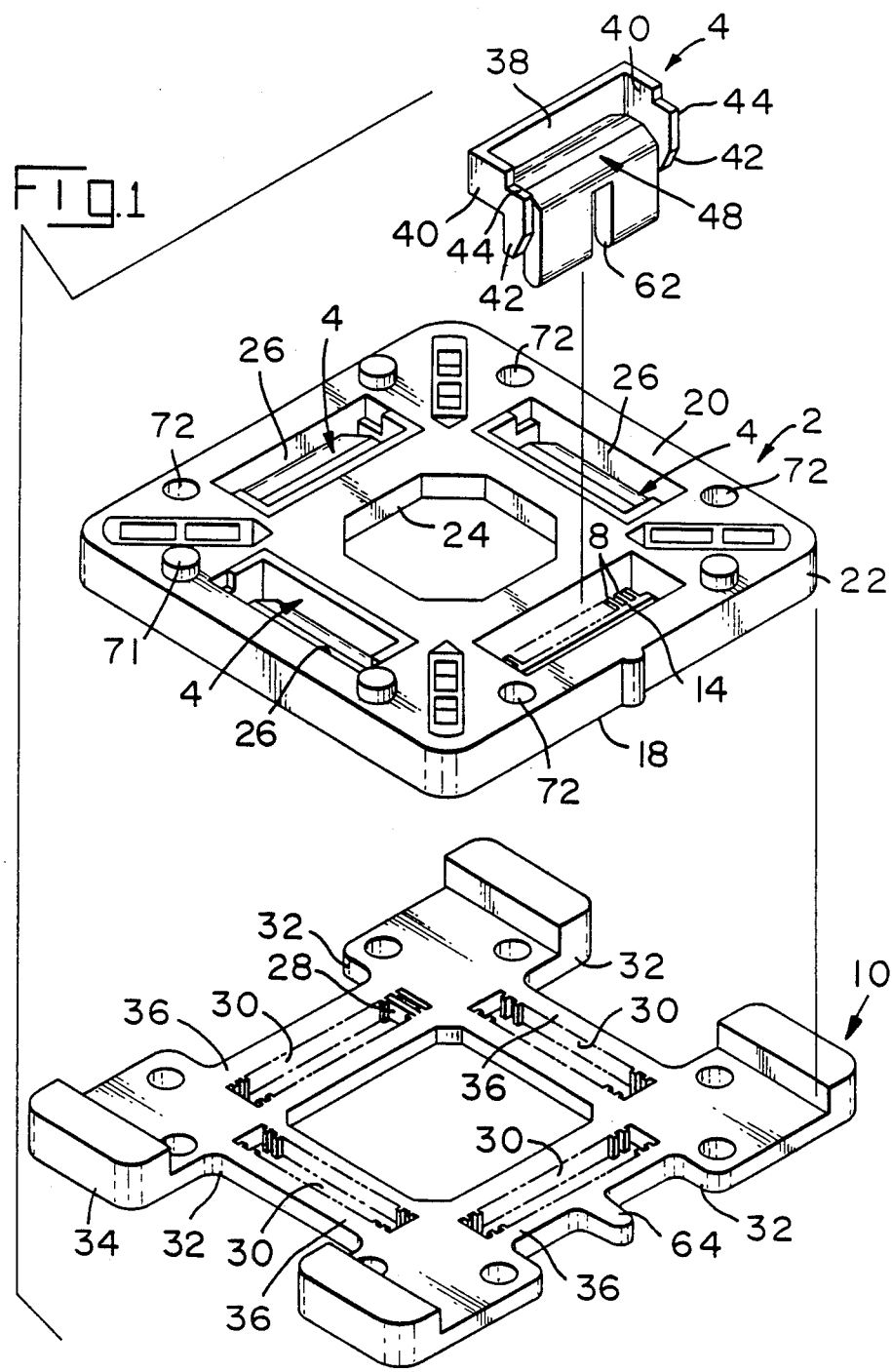
FIG. 1 is a perspective view of a protective fixture with a protective insert and a socket exploded therefrom.

Referring to FIG. 1, a fixture 2 having protective inserts 4 in accordance with the invention is dimensioned to receive a chip carrier 6 (FIGS. 2 and 3) having thin sheet metal leads 8 extending therefrom. Fixture 2 is of the type described in U.S. patent application Ser. No. 784,917 filed Oct. 4, 1986. Fixture 2 with protective inserts 4 cooperates with socket 10 and a board 12 of a test apparatus (FIGS. 2 and 3) to allow testing of an integrated circuit positioned in chip carrier 6. In this example, the ends of leads 8 are integral with carrier strips 14. Carrier strips 14 must be removed before the integrated circuit can be tested and leads 8 must also be bent prior to mounting chip carrier 6 on a circuit board. It should be mentioned that, in some instances, carrier strips 14 will extend in each direction beyond leads 8 and be joined to the carrier strips extending from adjacent sides. In ther words, a continuous carrier strip may extend entirely around the chip carrier 6.

Fixture 2 is comprised of insulating material, such as thermoplastic, having first and second oppositely facing major surfaces 16, 18, and a circumferential surface 22 which conforms to the shape and dimensions of chip carrier 6. A central opening 24 is provided on fixture 2 to permit removal of chip carrier 6 from fixture 2.

Rectangular tool clearance openings 26 are provided in surrounding relationship to opening 24 and extend parallel to the peripheral edges of fixture 2. Lead-supporting surfaces (not shown) are slightly beneath the plane of the first major surface 18 of fixture 2 and are provided with side-by-side lead-receiving channels, so that leads 8 will be precisely positioned. Leads 8 extend partially into openings 26, the ends of leads 8 and carrier strip 14 being positioned in openings 26. However, leads 8 and carrier strip 14 will be between the planes of the first and second major surfaces 18, 20 and will thereby be protected. Inserts 4 cooperate with openings 26 and leads 8 as will be discussed.

Socket 10 has contacts 28 positioned in openings 30. Contacts electrically connect leads 8 of chip carrier 6 to pads (not shown) on board 12 of test apparatus. Channels 32 in endwalls 34 of socket 10 provide clearance for inserts 4. Bars 36 of socket 10 also cooperate with inserts 4, as will be discussed.

Inserts 4 are molded from a conductive material, preferably a plastic which has carbon or graphite fibers added to produce the desired conductive characteristics. The conductive properties of insert 4 are extremely important as insert 4 must act as a shorting or grounding bar with respect to leads 8 of chip carrier 6.

Each insert 4, as can be seen from FIG. 1, has a backwall 38 and two sidewalls 40. These walls 38, 40 cooperate with sides of openings 26 of fixture 2 to provide an interference fit between openings 26 and inserts 4.

Sidewalls 40 have projections 42 which extend below the plane of the bottom surfaces of walls 38, 40. Recesses 44 are positioned on sidewalls 40 directly above projections 42. The purpose of projections 42 and recesses 44 will be discussed below.

Figure 2:
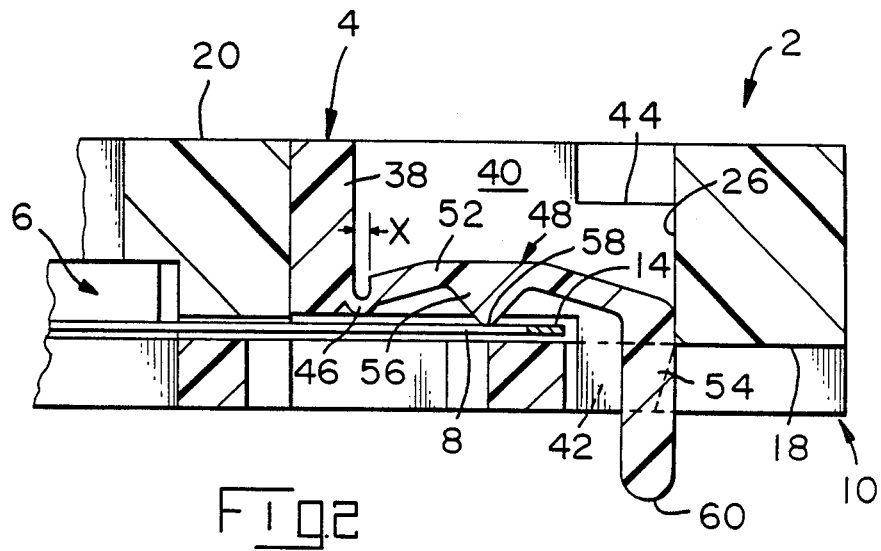
FIG. 2 is a cross-sectional view taken along line 2—2 of FIG. 1 showing the protective insert positioned in an opening of the protective fixture.
Figure 3:
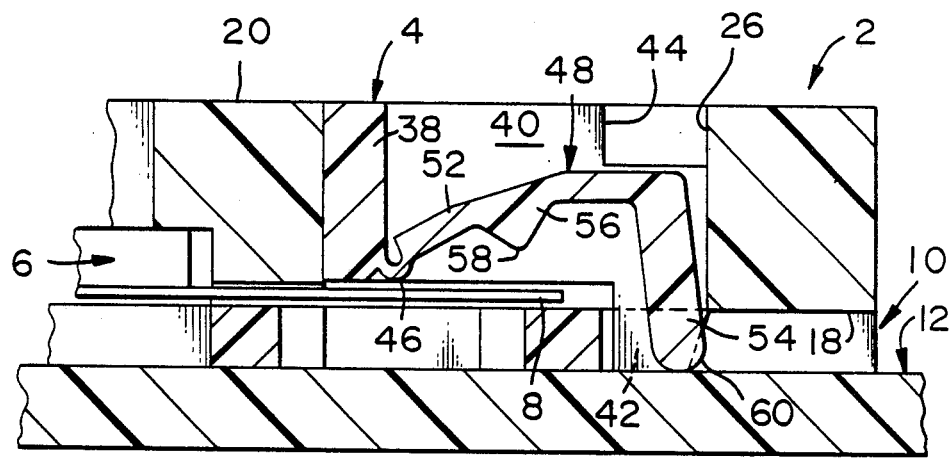
FIG. 3 is a view similar to that of FIG. 2 except that an end section of an arm has contacted a substrate causing the arm to pivot.

As shown in FIGS. 2 and 3, each insert 4 has a hinge member 46 which has a generally U-shaped configuration. One side of hinge member 46 is connected to the bottom surface of backwall 38 and the other side is connected to an inner end of an arm 48.

The inner end of arm 48 is spaced a distance X from an inner surface of the backwall 38. This spacing allows arm 48 to move relative to backwall 38, as can be seen in FIGS. 2 and 3. This movement will be more fully discussed below.

As can be seen in FIG. 2, arm 48 is comprised of a contact portion 52 and an end portion 54. Contact portion 52 has a generally flattened C-configuration and extends from hinge member 46 to end portion 54. A mid-section of contact portion 52 has a contact member 56 extending therefrom. Contact member 56 has a V-shape, a bottom 58 of the V provided to make electrical contact with leads 8 of the chip carrier 6 during transportation of fixture 2, as will be discussed.

End portion 54 extends downward from contact portion 52, end portion 54 being substantially parallel to the plane of backwall 38. End portion 54 extends below the ends of projections 42. An arcuate surface 60 is provided at a free end of end portion 54. As shown in FIG. 1, end portion 54 has a recess 62 which extends from arcuate free end 60 toward an inner end of end portion 54. Fixture 2 is aligned with socket 10 such that a respective insert 4 has its recess 62 cooperate with a projection 64 of socket 10.

In operation, inserts 4 are placed in openings 26 and held in place due to the interference fit of walls 38, 40 in cooperation with the side surfaces of openings 26. It should be noted that the height of walls 38, 40 corresponds to the thickness of fixture 2. Therefore, the inserts 4 are properly positioned in openings 26 when the upper surfaces of walls 38, 40 align with second major surface 20 of fixture 2. Inserts 4 are dimensioned to correspond to the size of openings 26 such that insert 4 fits snugly into place in opening 26. This ensures that backwall 38 and sidewalls 40 of each insert 4 will cooperate with the side surfaces of a respective opening 26 to allow only a minimal amount of movement of the insert 4 relative to fixture 2, thereby guaranteeing proper positioning of insert 4 in opening 26.

In the fully inserted, first position as shown in FIG. 2, contact member 56 of arm 48 makes contact with leads 8. Arm 48 is pivoted slightly about hinge member 46 to provide the contact force required for contact member 56 to make positive contact with the leads 8. As inserts 4 are made from conductive plastic, positive electrical contact with the leads 8 is ensured, thereby shorting leads 8 and enabling chip carrier 6 to avoid harmful electrostatic discharge. In this first position, a section of end portion 54 extends down through a portion of opening 26, past the first major surface 18 of fixture 2. The portion of opening 26 through which end portion 54 extends is where no leads 8 are present. As previously stated, leads 8 extend approximately half-way across opening 26, terminating in carrier strip 14. Consequently, portions of openings 26 between the side surfaces and carrier strips 14 extend through fixture 2, enabling end portions 54 to extend through without contacting leads 8.

This first position is maintained as transportation of fixture 2 occurs, thereby protecting chip carrier 6 and the integrated circuit contained thereon from damage. As shown in FIG. 4, during transportation fixtures 2 are stacked in a "loaf" type configuration. Each insert 4 makes electrical contact with respective inserts 4 of adjacent fixtures 2, forming a continuous conductive column which extends from the top to the bottom of the "loaf". This electrical connection is accomplished by the cooperation of inserts 4. Projections 42 of respective inserts 4 of one fixture 2 align and make electrical contact with respective recesses 44 of inserts 4 of another fixture 2. At the ends of the "loaf" are caps 68 which allow electrostatic discharge to drain from inserts 4 to caps 68, thus protecting chip carriers 6 during transportation. Caps 68 are made from material having the required characteristics, such as aluminum.

The "loaf" is also hermetically sealed to keep harmful dust and the like from accumulating on chip carrier 6 and leads 8 thereof. Alignment projections 71 of fixture 2 cooperate with respective holes (not shown) on major surface 18 of another fixture to insure proper positioning of each fixture in the "loaf". The sealing is done by rods 70 which extend through aligned holes 72 of fixtures 2 and sockets 70 and holes 74 of caps 68. Rods 70 are tightened to seal fixtures 2 together and to ensure inserts 4 make positive electrical contact with each other and with caps 68.

When fixtures 2 arrive at their destination, the "loaf" is disassembled into individual fixtures 2 and "burn-in" testing usually occurs to ensure that the integrated circuit contained in chip carrier 6 is functioning properly. It is at this point that insert 4 must be removed and carrier strip 14 cut away. If chip carrier 6 is to be stored, insert 4 will be positioned back in opening 26, as will be assumed for purposes of description. If, however, chip carrier 6 is to be put in use directly after testing, insert 4 will not be replaced as there is no need to protect the integrated circuit on chip carrier 6 from electrostatic discharge.

The first major surface 18 of fixture 2 is brought into contact with socket 10 which is in contact with board 12 of the test apparatus. This causes arcuate free end 60 of end portion 54 of arm 48 to extend through channel 32 of socket 10 to contact a surface of board 12 of the apparatus, forcing arm 48 to pivot about hinge member 46 to the second position, shown in FIG. 3. In this second position, arcuate free end 60 of end portion 54 is essentially in the same plane as first major surface 18 of fixture 2 and V-shaped contact member 56 is electrically disengaged from leads 8, enabling the testing process to be properly conducted.

Projections 42 also contact bars 36 of socket 10 as testing occurs. The dimensions of projections 42 are such that as the ends of projections 42 contact bars 36, walls 38, 40 are assured of being disengaged from leads 8. This clearance ensures that all conductive material of arm 48 is disengaged from leads 8 when the second position is reached, thereby allowing proper testing to occur.

After completion of the testing process, fixture 2 is removed from the apparatus. Arm 48 is returned to its first position with contact 56 in electrical contact with leads 8, as shown in FIG. 2. This first position is obtained due to the resilient characteristics of hinge member 46. As fixture 2 is removed from the apparatus, no external forces are applied on end portion 54, allowing hinge member 46 to return arm 48 to the first position. Consequently, chip carrier 6 is again protected from electrostatic discharge, enabling fixture 2 to be safely stored until needed.

As chip carrier 6 is prepared for practical use, inserts 4 are removed so that tooling can contact leads 8 through openings 26, allowing leads 8 to be formed. As inserts 4 are merely retained by an interference fit and as hinge members 46 are resilient, inserts 4 may be reused, to protect another chip carrier during transportation.

The protective inserts have many advantages. They may be used with an already existing fixture. Single piece construction from conductive plastics makes them simple to use and relatively cheap to manufacture. Their reusability along with the reusability of the fixtures and sockets makes the entire system cost effective. But perhaps most importantly, their automatic nature guarantees that the arm will be in contact with the leads when required for protection and disengaged from the leads when testing is complete.

I claim:

1. A protective insert for use with a protective fixture for a chip carrier, the insert comprising:
   sidewalls positioned parallel to each other, the sidewalls connected by a backwall and extending therefrom, the backwall being perpendicular to the sidewalls;
   an arm extending from the backwall in the same direction as the sidewalls, the arm having a contact section and an end section, the contact section having contact means to cooperate with leads of the chip carrier on a socket when the insert is positioned in an insert-receiving opening of the protective fixture, the end section being essentially parallel to the backwall and having a free end which extends beyond the contact means;
   pivot means joining the arm to the backwall;
   whereby as the free end of the end section is contacted, the arm pivots about the pivot means enabling the contact means of the contact section to disengage from the leads of the chip carrier.

2. A protective insert as recited in claim 1 wherein the arm has a recess, the recess being in alignment with a projection of the socket with which the fixture cooperates.

3. A protective insert as recited in claim 1 wherein the walls of the insert cooperate with side surfaces of the opening to secure the insert in place by means of an interference fit.

4. A protective insert as recited in claim 1 wherein the contact means has a generally V-shaped configuration, the bottom thereof electrically contacting the leads of the chip carrier.

5. A protective insert as recited in claim 2 wherein projections extend from the sidewalls, the projections cooperating with the socket to ensure that walls of the insert do not contact the leads of the chip carrier.

6. A protective insert as recited in claim 5 wherein recesses are provided directly above the projections of the sidewalls, the recesses cooperating with respective projections of other inserts to allow the fixtures to be stackable.

7. A protective fixture for a chip carrier comprising:
   a carrier body having oppositely facing major surfaces;
   electrical leads extending from the carrier body in side-by-side spaced apart relationship;
   a fixture body having oppositely facing first and second major surfaces, a centrally located recess on the first major surface, and carrier locating means for locating the carrier body in the recess;
   retention means located on the fixture body, the retention means cooperating with the carrier body to maintain the carrier body in the recess;
   a plurality of openings extending through the fixture body from the first major surface to the second major surface, the openings being positioned such that free ends of the leads terminate in the opening;
   a protective member positioned in the opening, the protective member having walls which cooperate with corresponding walls of the opening to retain the member in place, an arm pivotably mounted to a respective wall of the member, the arm having a contact section and an end section;
   whereby as the protective fixture is not in use, the contact section of the protective member contacts the leads to prevent electrostatic discharge of the chip carrier; as the protective fixture is tested, the end of the arm is contacted causing the arm to pivot, disengaging the contact section from the leads, enabling proper testing to occur; upon completion of the test, the arm pivots back placing the contact section in electrical contact with the leads.

* * * * *